US012685144B2

(12) United States Patent
Huang

(10) Patent No.: US 12,685,144 B2
(45) Date of Patent: Jul. 14, 2026

(54) SEMICONDUCTOR DEVICE WITH FILLING LAYER

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 529 days.

(21) Appl. No.: 18/119,947

(22) Filed: Mar. 10, 2023

(65) Prior Publication Data

US 2024/0304552 A1 Sep. 12, 2024

(51) Int. Cl.
H01L 23/532 (2006.01)
H01L 21/768 (2006.01)

(52) U.S. Cl.
CPC ...... H01L 23/5329 (2013.01); H01L 21/7682 (2013.01)

(58) Field of Classification Search
CPC ........... H01L 21/7682; H01L 21/76831; H01L 21/76877; H01L 23/5226; H01L 23/5329; H01L 23/53295
See application file for complete search history.

(56) References Cited

U.S. PATENT DOCUMENTS

| | | | | |
|---|---|---|---|---|
| 5,728,631 A | * | 3/1998 | Wang | H01L 21/7682 |
| | | | | 438/787 |
| 6,433,436 B1 | * | 8/2002 | Feild | H01L 21/76897 |
| | | | | 257/773 |
| 10,199,325 B2 | * | 2/2019 | Yim | H01L 21/76897 |
| 11,355,430 B2 | * | 6/2022 | Lo | H01L 21/76831 |
| 11,682,616 B2 | * | 6/2023 | Lu | H01L 21/76831 |
| | | | | 257/751 |
| 2016/0315081 A1 | * | 10/2016 | Park | H10D 62/151 |
| 2021/0090939 A1 | * | 3/2021 | Huang | H10B 12/482 |

FOREIGN PATENT DOCUMENTS

TW    I726725 B    5/2021

OTHER PUBLICATIONS

Office Action and and the search report mailed on Nov. 27, 2023 related to Taiwanese Application No. 112120880.

* cited by examiner

*Primary Examiner* — John M Parker
(74) *Attorney, Agent, or Firm* — Xuan Zhang

(57) ABSTRACT

The present application discloses a semiconductor device and a method for fabricating the semiconductor device. The semiconductor device includes a substrate; a plurality of conductive layers positioned on the substrate; a filling layer positioned between the plurality of conductive layers; an air gap positioned in the filling layer; and a dielectric layer positioned on the plurality of conductive layers and the filling layer. The filling layer includes boron carbonitride.

7 Claims, 16 Drawing Sheets

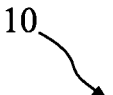

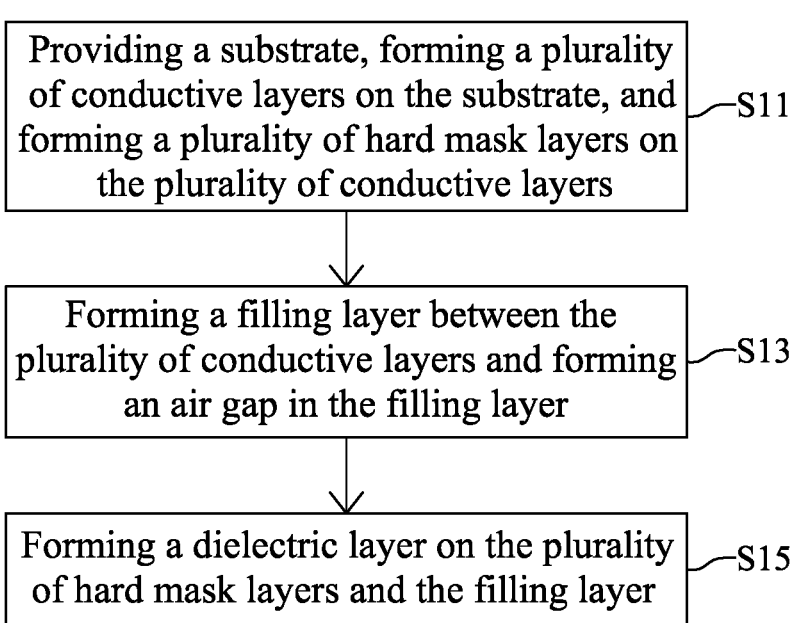

Providing a substrate, forming a plurality of conductive layers on the substrate, and forming a plurality of hard mask layers on the plurality of conductive layers —S11

Forming a filling layer between the plurality of conductive layers and forming an air gap in the filling layer —S13

Forming a dielectric layer on the plurality of hard mask layers and the filling layer —S15

FIG. 1

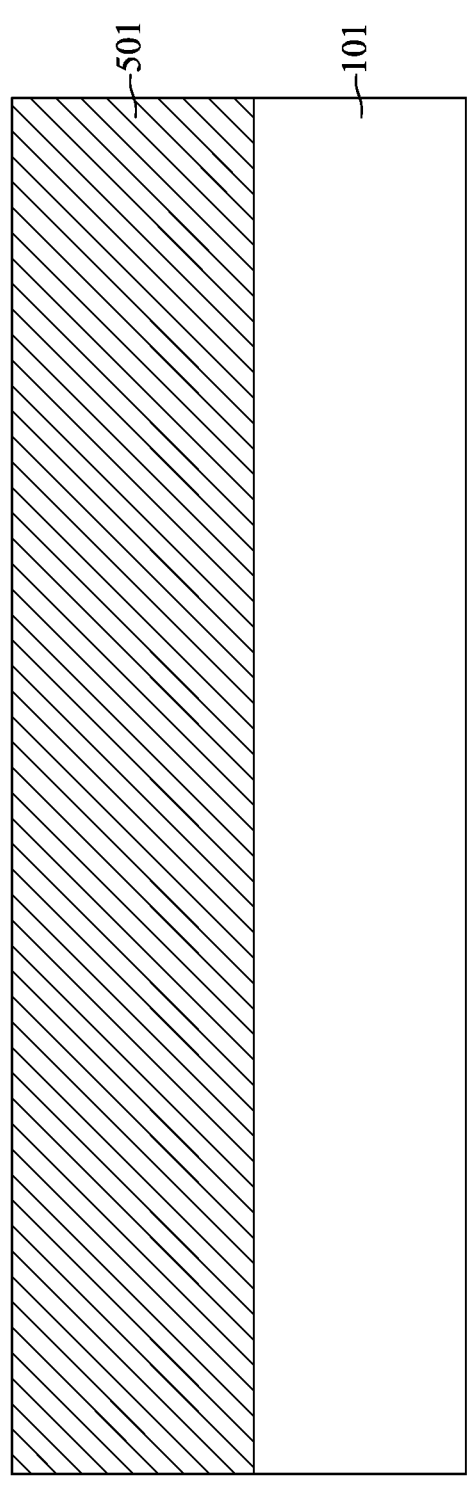
FIG. 2

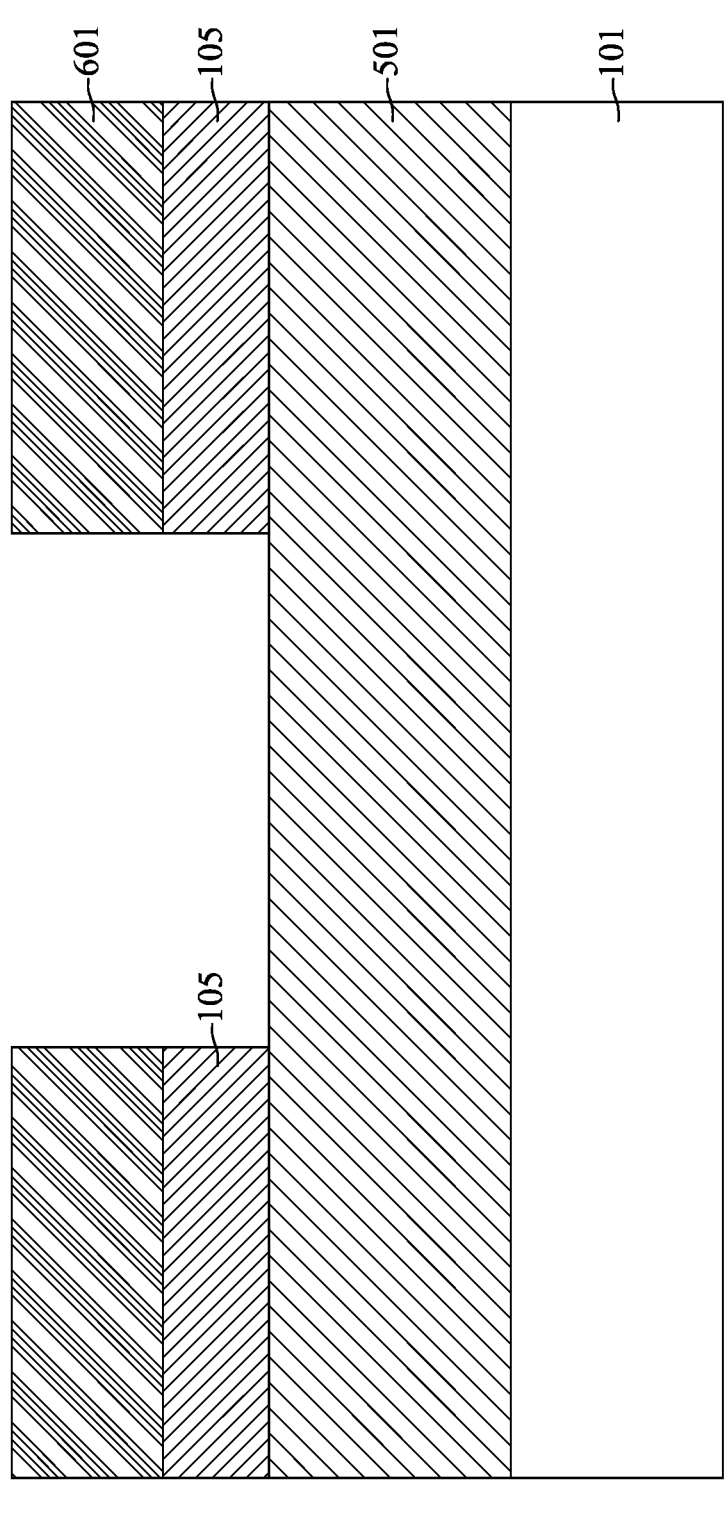
FIG. 4

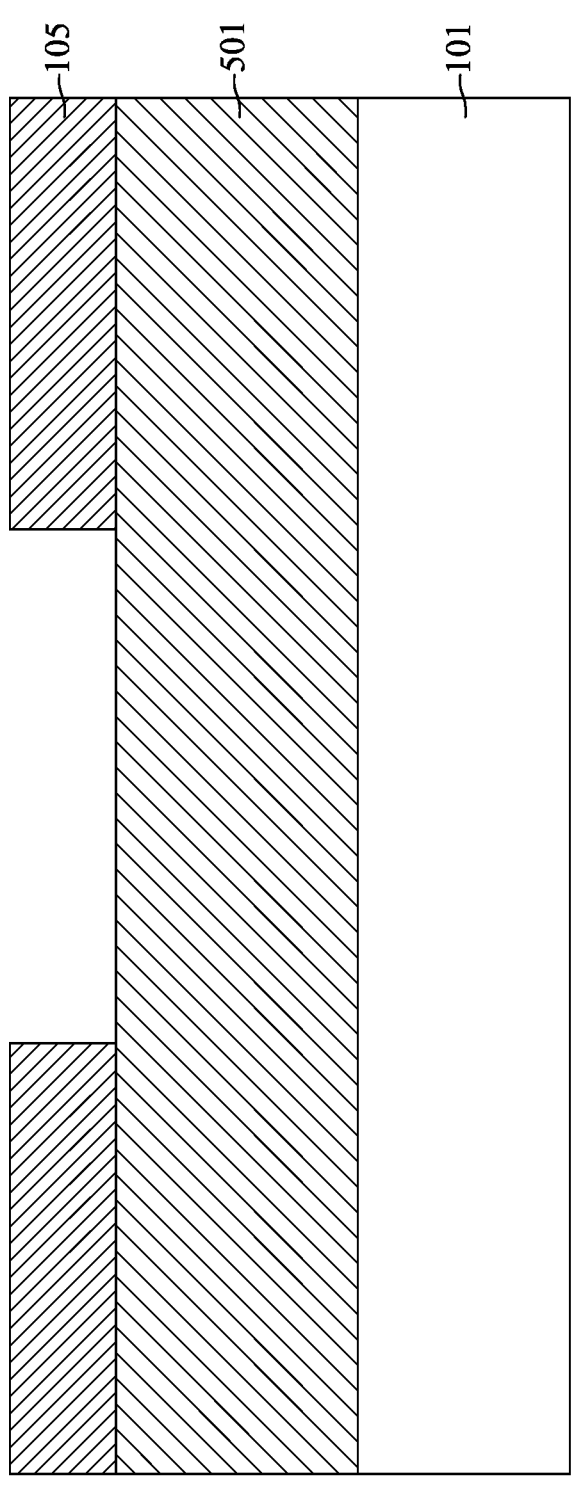
FIG. 5

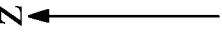
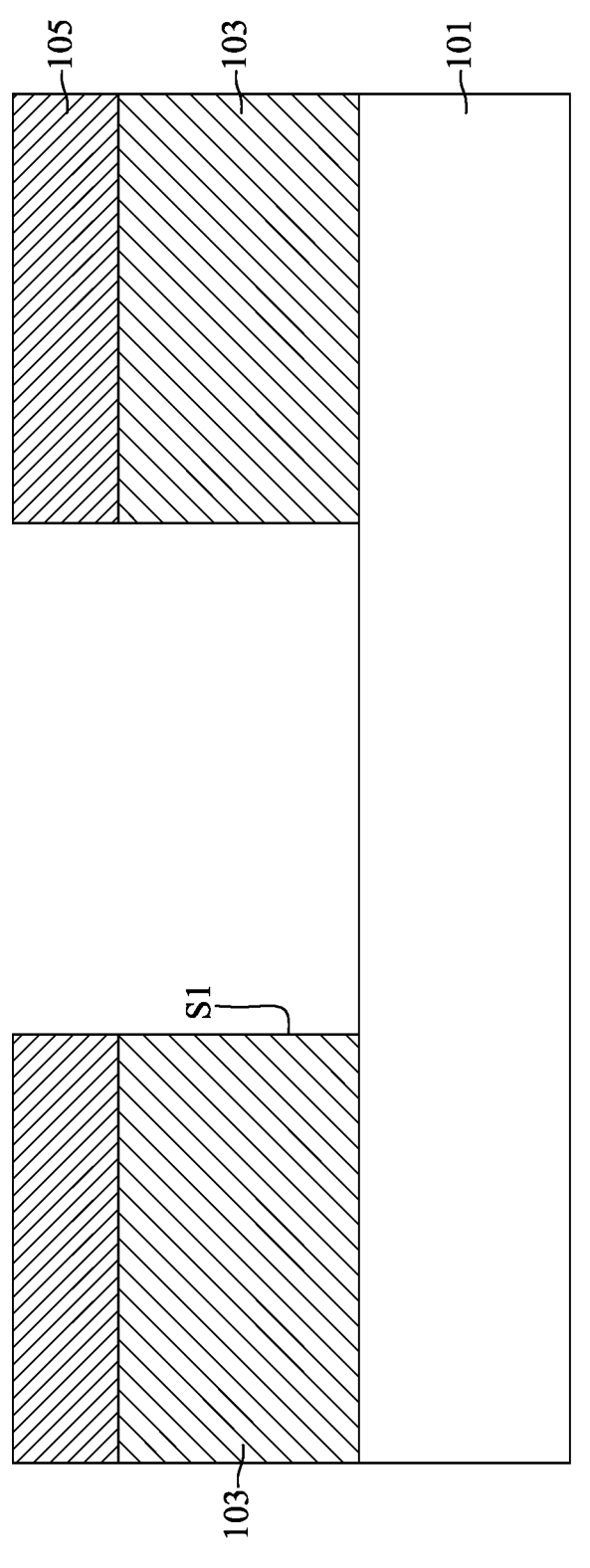
FIG. 6

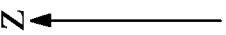
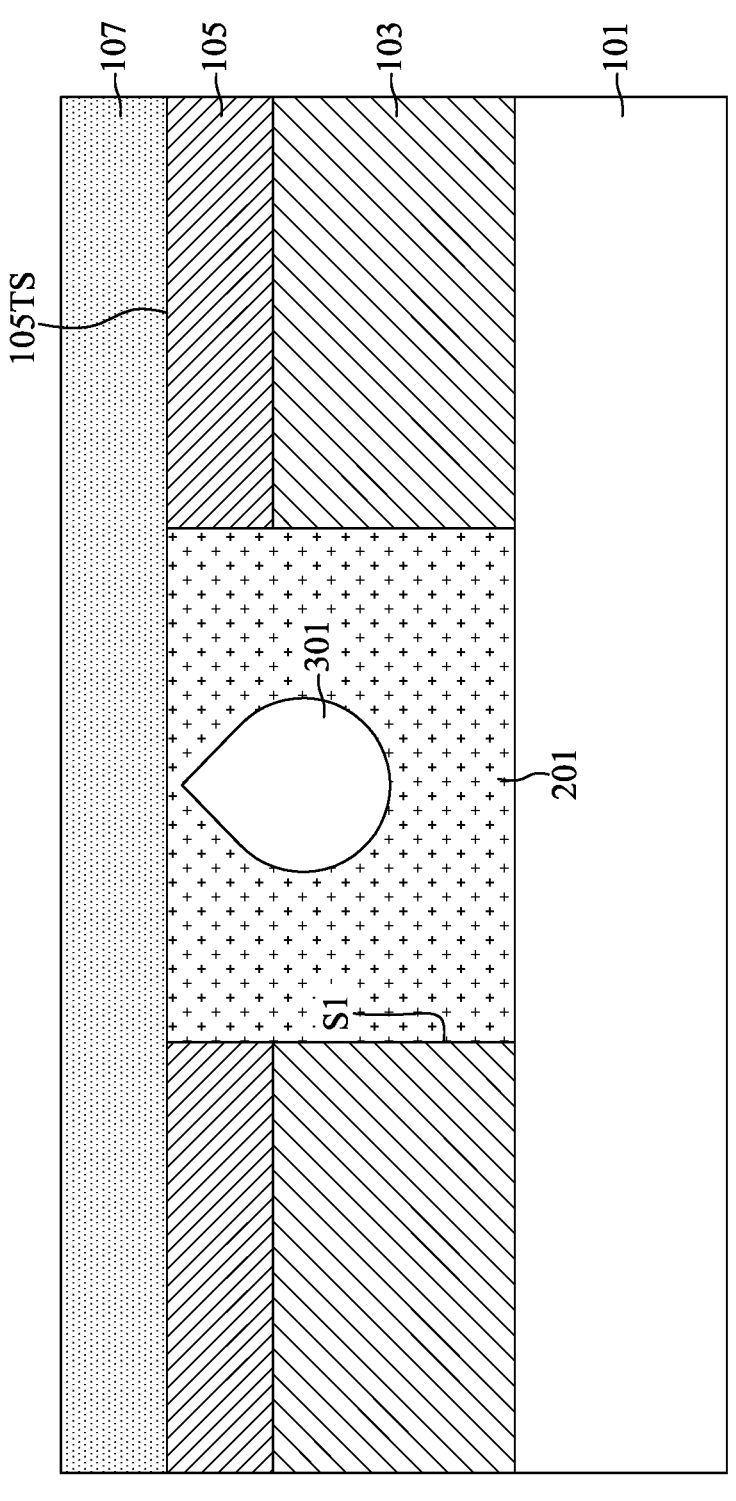
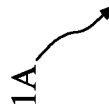
FIG. 9

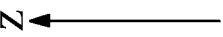
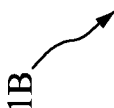
FIG. 12

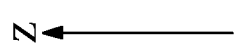
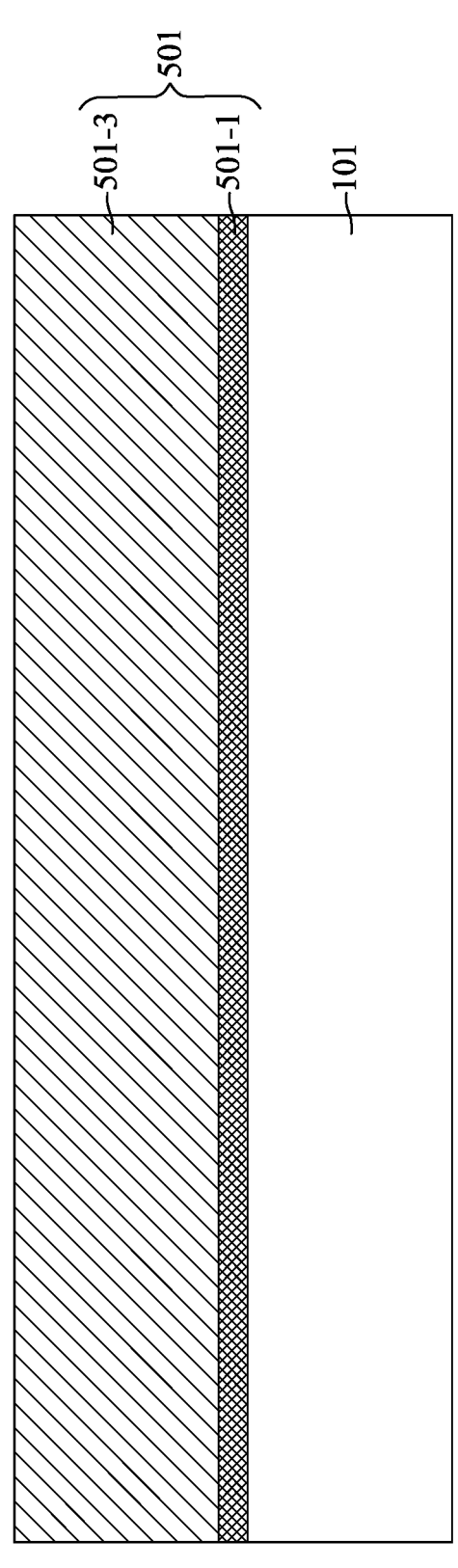
FIG. 13

SEMICONDUCTOR DEVICE WITH FILLING LAYER

TECHNICAL FIELD

The present disclosure relates to a semiconductor device and a method for fabricating the semiconductor device, and more particularly, to a semiconductor device with a filling layer and a method for fabricating the semiconductor device with the filling layer.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a plurality of conductive layers positioned on the substrate; a filling layer positioned between the plurality of conductive layers; an air gap positioned in the filling layer; and a dielectric layer positioned on the plurality of conductive layers and the filling layer. The filling layer includes boron carbonitride.

Another aspect of the present disclosure provides a semiconductor device including a substrate; a plurality of conductive layers positioned on the substrate; a filling layer positioned between the plurality of conductive layers; a dielectric layer positioned on the plurality of conductive layers and the filling layer; and an air gap positioned in the filling layer and sealed by the dielectric layer. The filling layer includes boron carbonitride.

Another aspect of the present disclosure provides a method for fabricating a semiconductor device including providing a substrate;

forming a plurality of conductive layers on the substrate and forming a plurality of hard mask layers on the plurality of conductive layers; forming a filling layer between the plurality of conductive layers and between the plurality of hard mask layers and forming an air gap in the filling layer; and forming a dielectric layer on the plurality of hard mask layers and the filling layer. The filling layer includes boron carbonitride.

Another aspect of the present disclosure provides a method for fabricating a semiconductor device including providing a substrate; forming a plurality of conductive layers on the substrate; forming a plurality of hard mask layers on the plurality of conductive layers; forming a layer of filling material to cover top surfaces of the plurality of hard mask layers and partially fill a space between the plurality of conductive layers; performing a planarization process until the top surfaces of the plurality of hard mask layers are exposed to turn the layer of filling material into the filling layer and concurrently form a recess in the filling layer; and forming a dielectric layer on the plurality of hard mask layers and the filling layer and sealing the recess to form an air gap. The filling layer includes boron carbonitride.

Due to the design of the semiconductor device of the present disclosure, the parasitic capacitance between the plurality of conductive layers may be reduced by employing the filling layer having low dielectric constant and the air gap. As a result, the performance of the semiconductor device may be improved.

The foregoing has outlined rather broadly the features and technical advantages of the present disclosure in order that the detailed description of the disclosure that follows may be better understood. Additional features and advantages of the disclosure will be described hereinafter and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1 illustrates, in a flowchart diagram form, a method for fabricating a semiconductor device in accordance with one embodiment of the present disclosure;

FIGS. 2 to 9 illustrate, in schematic cross-sectional view diagrams, a flow for fabricating the semiconductor device in accordance with one embodiment of the present disclosure;

FIGS. 10 to 12 illustrate, in schematic cross-sectional view diagrams, part of a flow for fabricating a semiconductor device in accordance with another embodiment of the present disclosure;

FIGS. 13 to 15 illustrate, in schematic cross-sectional view diagrams, part of a flow for fabricating a semiconductor device in accordance with another embodiment of the present disclosure.

DETAILED DESCRIPTION

Figure 3:
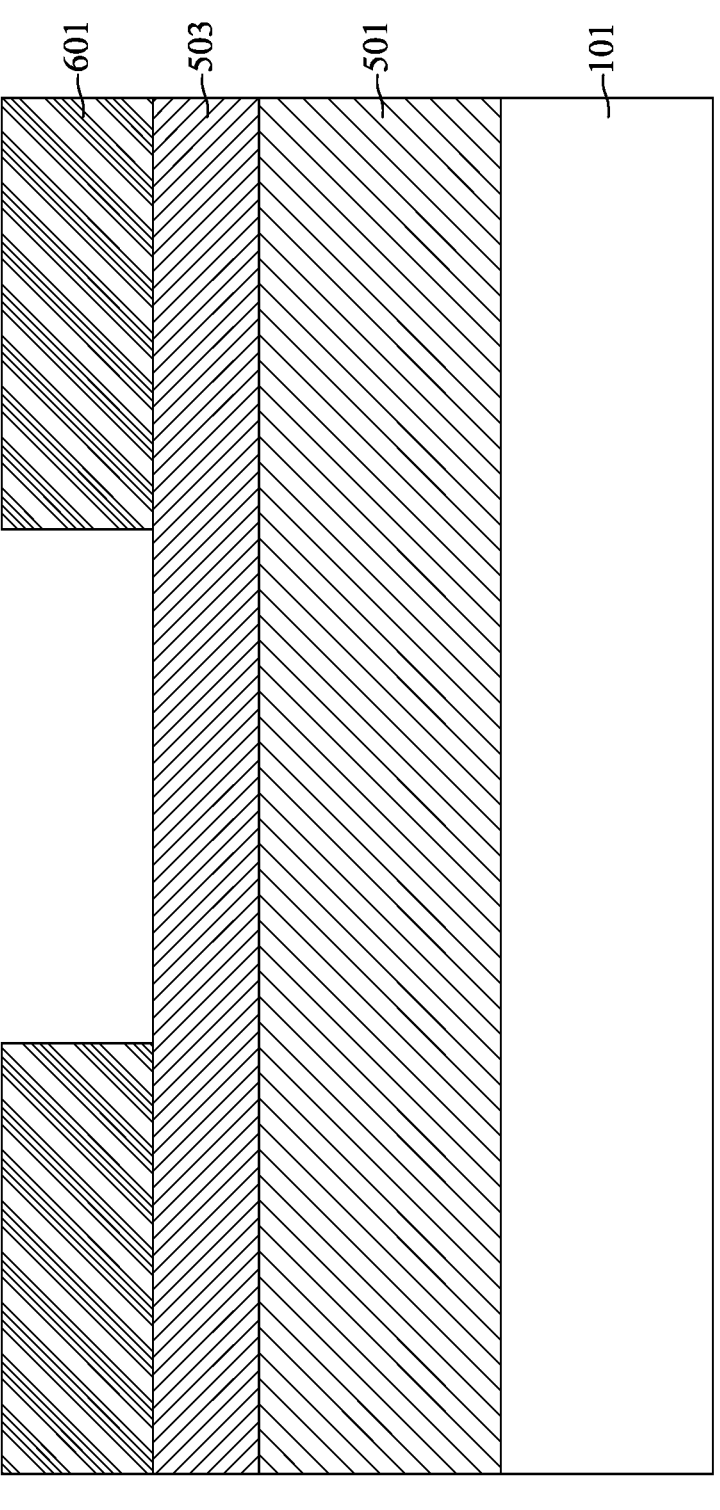

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 9 illustrate, in schematic cross-sectional view diagrams, a flow for fabricating the semiconductor device 1A in accordance with one embodiment of the present disclosure.

With reference to FIGS. 1 to 6, at step S11, a substrate 101 may be provided, a plurality of conductive layers 103 may be formed on the substrate 101, and a plurality of hard mask layers 105 may be formed on the plurality of conductive layers 103.

With reference to FIG. 2, the substrate 101 may include a bulk semiconductor substrate that is composed entirely of at least one semiconductor material, a plurality of device elements (not shown for clarity), a plurality of dielectric layers (not shown for clarity), and a plurality of conductive features (not shown for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may further include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, in the description of present disclosure, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

The plurality of device elements may be formed on the substrate 101. Some portions of the plurality of device elements may be formed in the substrate 101. The plurality of device elements may be transistors such as complementary metal-oxide-semiconductor transistors, metal-oxide-semiconductor field-effect transistors, fin field-effect-transistors, the like, or a combination thereof.

The plurality of dielectric layers may be formed on the substrate 101 and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like.

Planarization processes may be performed after the deposition processes to remove excess material and provide a substantially flat surface for subsequent processing steps.

The plurality of conductive features may include interconnect layers, conductive vias, and conductive pads. The interconnect layers may be separated from each other and may be horizontally disposed in the plurality of dielectric layers along the direction Z. In the present embodiment, the topmost interconnect layers may be designated as the conductive pads. The conductive vias may connect adjacent interconnect layers along the direction Z, adjacent device element and interconnect layer, and adjacent conductive pad and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive layers may together configure functional units of the semiconductor device 1A. A functional unit, in the description of the present disclosure, generally refers to functionally related circuitry that has been partitioned for functional purposes into a distinct unit. In some embodiments, the functional units of the semiconductor device 1A may include, for example, highly complex circuits such as processor cores, memory controllers, accelerator units, or other applicable functional circuitry.

With reference to FIG. 2, the layer of conductive material 501 may be formed on the substrate 101. In some embodiments, the conductive material 501 may be, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the layer of conductive material 501 may be formed by, for example, physical vapor deposition, chemical vapor deposition, sputtering, electroplating, or other applicable deposition processes.

With reference to FIG. 3, a layer of hard mask material 503 may be formed on the layer of conductive material 501. In some embodiments, the hard mask material 503 may be a material having etching selectivity to the conductive material 501. In some embodiments, the hard mask material 503 may be, for example, silicon oxide, silicon nitride, silicon oxynitride, or silicon nitride oxide. In some embodiments, the hard mask material 503 may be composed of carbon, hydrogen, and oxygen. In some embodiments, the hard mask material 503 may be composed of carbon, hydrogen, and fluorine. In some embodiments, the layer of hard mask material 503 may be a carbon film. The term "carbon film" is used herein to describe materials whose mass is primarily carbon, whose structure is defined primarily by carbon atoms, or whose physical and chemical properties are dominated by its carbon content. The term "carbon film" is meant to exclude materials that are simply mixtures or compounds that include carbon, for example dielectric materials such as carbon-doped silicon oxynitride, carbon-doped silicon oxide or carbon-doped polysilicon.

In some embodiments, the carbon film may include carbon and hydrogen atoms, which may be an adjustable carbon: hydrogen ratio that ranges from about 10% hydrogen to about 60% hydrogen.

Controlling the hydrogen ratio of the carbon film may tune the respective etch resistance property and chemical mechanical polishing resistance property. As the hydrogen content decreases, the etch resistance property, and thus the etch selectivity, of the carbon film increases. The reduced rate of removal of the carbon film may make the carbon film suitable for being a mask layer when performing an etch process to transfer the desired pattern onto the underlying layers.

In some embodiments, the layer of hard mask material 503 may be formed by, for example, chemical vapor deposition, plasma-enhanced chemical vapor deposition, or other applicable deposition processes. In some embodiments, when the layer of hard mask material 503 is a carbon film, the layer of hard mask material 503 may be deposited by a process including introducing a processing gas mixture, consisting of one or more hydrocarbon compounds, into a processing chamber. The hydrocarbon compound has a formula $C_xH_y$, where x has a range of between 2 and 4 and y has a range of between 2 and 10. The hydrocarbon compounds may be, for example, propylene ($C_3H_6$), propyne ($C_3H_4$), propane ($C_3H_8$), butane ($C_4H_{10}$), butylene ($C_4H_8$), butadiene ($C_4H_6$), acetylene ($C_2H_2$), or a combination thereof.

In some embodiments, the carbon film may be deposited from the processing gas mixture by maintaining a substrate temperature (also referred to as the process temperature) between about 100° C. and about 700° C. or between about 350° C. and about 550° C. In some embodiments, the carbon film may be deposited from the processing gas mixture by maintaining a chamber pressure (also referred to as the process pressure) between about 1 Torr and about 20 Torr. In some embodiments, the carbon film may be deposited from the processing gas mixture by introducing the hydrocarbon gas, and any inert, or reactive gases respectively, at a flow rate between about 50 sccm and about 2000 sccm.

In some embodiments, the processing gas mixture may further include an inert gas, such as argon. However, other inert gases, such as nitrogen or other noble gases, such as helium may also be used. Inert gases may be used to control the density and deposition rate of the carbon film. Additionally, a variety of gases may be added to the processing gas mixture to modify properties of the carbon film. The gases may be reactive gases, such as hydrogen, ammonia, a mixture of hydrogen and nitrogen, or a combination thereof. The addition of hydrogen or ammonia may be used to control the hydrogen ratio of the carbon film to control layer properties, such as etch selectivity, chemical mechanical polishing resistance property, and reflectivity. In some embodiments, a mixture of reactive gases and inert gases may be added to the processing gas mixture to deposit the carbon film.

With reference to FIG. 3, a first mask layer 601 may be formed on the layer of hard mask material 503. The first mask layer 601 may include the pattern of the plurality of conductive layers 103.

In some embodiments, the first mask layer 601 may be a photoresist layer.

With reference to FIG. 4, a first hard mask etching process may be performed to remove a portion of the hard mask material 503 and to transfer the pattern of the first mask layer 601 to the layer of hard mask material 503. After the first hard mask etching process, the layer of hard mask material

503 may be turned into the plurality of hard mask layers 105 on the layer of conductive material 501. In some embodiments, the etch rate ratio of the hard mask material 503 to the conductive material 501 may be between about 100:1 and about 1.05:1, between about 15:1 and about 2:1, or between about 10:1 and about 2:1 during the first hard mask etching process. In some embodiments, the etch rate ratio of the hard mask material 503 to the first mask layer 601 may be between about 100:1 and about 1.05:1, between about 15:1 and about 2:1, or between about 10:1 and about 2:1 during the first hard mask etching process.

In some embodiments, the etching gases of the first hard mask etching process may be, for example, oxygen-containing gases such as a mixture of an oxygen gas and a nitrogen gas.

In some embodiments, the first hard mask etching process may be an anisotropic plasma etching process. The anisotropic plasma etching process may be performed by plasma etching equipment utilizing an inductively coupled plasma technique or using a dual frequency capacitively coupled plasma technique, or any other suitable plasma technique. In some embodiments, the etchant gases of the anisotropic plasma etching process may be a mixture of an oxygen gas and a silicon-containing gas. The silicon-containing gas may be silicon tetrafluoride, silicon tetrachloride, silane, $SiCl_xF_y$ (wherein x+y=4), or a combination thereof. The etchant gases of the anisotropic plasma etching process may include about 50% to 95% by volume of the oxygen gas and correspondingly about 50% to 5% by volume of the silicon-containing gas respectively based on the total volume of the etchant gases at a given process temperature and process pressure.

Alternatively, in some embodiments, the etching gases of the anisotropic plasma etching process (i.e., the first hard mask etching process) may include the oxygen gas, the silicon-containing gas, and at least one gas selected from a nitrogen gas and an inert gas. Detailedly, the etchant gases of the anisotropic plasma etching process may include about 20% to 95% by volume of the oxygen gas based on the total volume of the etchant gases, about 50% to 5% by volume of the silicon-containing gas based on the total volume of the etchant gases, about % to 100% by volume of the nitrogen gas relative to the volume of the oxygen gas in the etchant gases, and about 0% to 50% by volume of the inert gas relative to the volume of oxygen gas in the etchant gases. It should be noted that the content of the nitrogen gas and the content of the inert gas in the etchant gases are not both zero. The presence of the nitrogen gas in the etchant gases provides a lower etch rate than would undiluted oxygen gas with respect to the layer of hard mask material 503, but the nitrogen gas serves to increase passivation of the exposed sidewalls of the layer of hard mask material 503 during the first hard mask etching process. This may improve anisotropic etching properties. The presence of inert gas in the etching gases improves anisotropic dry etching properties of the etching gases and stabilizes the plasma atmosphere. The inert gas may be selected from the group consisting of argon, helium, neon and krypton.

Alternatively, in some embodiments, the etchant gases of the anisotropic plasma etching process (i.e., the first hard mask etching process) may further include a carbon-fluorine-series gas, such as carbon tetrafluoride, hexafluoroethane, perflutren, octafluorocyclobutane, hexafluorocyclobutene, octafluorocyclopentene, or the like. The carbon-fluorine-series gas may be added to the etchant gases to increase an etch rate of the layer of hard mask material 503. The etchant gases may include, for example, about 0% to 10% by volume of the carbon-fluorine-series gas based on the total volume of the etchant gases.

With reference to FIG. 5, the first mask layer 601 may be removed after the formation of the plurality of hard mask layers 105. In some embodiments, the first mask layer 601 may be removed by, for example, an ashing process or other applicable semiconductor processes.

With reference to FIG. 6, a first etching process may be performed to remove a portion of the conductive material 501 and turn the layer of conductive material 501 into the plurality of conductive layers 103 between the plurality of hard mask layers 105 and the substrate 101. A space S1 may be formed between an adjacent pair of the plurality of conductive layers 103. The substrate 101 may be partially exposed through the space S1. In some embodiments, the etch rate ratio of the conductive material 501 to the first mask layer 601 may be between about 100:1 and about 1.05:1, between about 15:1 and about 2:1, or between about 10:1 and about 2:1 during the first etching process.

Figure 7:
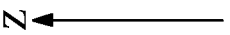
Figure 8:

With reference to FIGS. 1, 7, and 8, at step S13, a filling layer 201 may be formed between the plurality of conductive layers 103 and an air gap 301 may be formed in the filling layer 201.

With reference to FIG. 7, a layer of filling material 505 may be formed to cover the top surfaces 105S of the plurality of hard mask layers 105 and partially fill the space S1 between the plurality of conductive layers 103. The remaining empty portion of the space S1 may be referred to as the air gap 301. For example, the layer of filling material 505 may be formed with a higher deposition rate near the top corners of the plurality of hard mask layers 105. As a result, the filling material 505 near the top corners of the plurality of hard mask layers 105 may be firstly sealed to cause the air gap 301. In some embodiments, the top portion 301P of the air gap 301 may be at a vertical level VL1 lower than the top surfaces 105TS of the plurality of hard mask layers 105. In some embodiments, the filling material 505 may include boron carbonitride.

In some embodiments, a pre-treatment process may be applied to the space S1 before the formation of the layer of filling material 505. By pre-treating the surface of the space S1, adhesion of the layer of filling material 505 may be improved by producing favorable termination between the surface of the space S1 (e.g., the exposed surface of substrate 101 and the exposed sidewalls of the plurality of conductive layers 103) and the layer of filling material 505.

The pre-treatment process may be or include a thermal process or may include a plasma-enhanced process. Processing conditions may be maintained during the formation of the layer of filling material 505, as will be discussed below, which may facilitate the formation of the layer of filling material 505. In some embodiments, the pre-treatment process may include delivery of a hydrogen-containing precursor, a nitrogen-containing precursor, or some other precursor. Exemplary precursors may include hydrogen, ammonia, or other hydrogen-containing or nitrogen-containing precursors, among other materials that may pre-treat the surface of the space S1.

In some embodiments, the formation of the layer of filling material 505 may include providing a first precursor to the surface of the space S1, generating a capacitively-coupled plasma of the first precursor, and forming the layer of filling material 505.

In some embodiments, the first precursor may include boron, carbon, and/or nitrogen in the precursor. Non-limiting exemplary precursors may be or include tris (dimethylamino) borane, dimethylamine borane, trimethylamine borane, triethylamine borane, tetrakis (dimethylamino) diborane, or any other precursor including one or more of boron, carbon, and/or nitrogen. Additional precursors may be included in some embodiments to adjust atomic ratios. For example, additional hydrogen-containing precursors, carbon-containing precursors such as a hydrocarbon molecule, or nitrogen-containing precursors such as nitrogen gas and ammonia, may be included along with carrier or inert gases, such as helium, neon, argon, krypton, xenon, or nitrogen.

In some embodiments, co-reactants may be included during the formation of the layer of filling material 505. The co-reactants may include carbon dioxide, carbon monoxide, water, methanol, oxygen, ozone, nitrous oxide, and a combination thereof. Such materials may be used as nitriding agents, oxidizers, reductants, etc. In some embodiments, they can be used to tune an amount of carbon in the layer of filling material 505. In some cases, they can be used to tune an amount of nitrogen or oxygen in the layer of filling material 505. In some embodiments, the co-reactants may be introduced along with the first precursor, e.g., without direct exposure to the plasma.

The plasma power at which the process is performed may impact the layer (i.e., the layer of filling material 505) growth, as well as a variety of properties of the layer. For example, carbon incorporation within the layer may allow the dielectric constant to be reduced by incorporating additional methyl groups within the layer.

However, during plasma processing, methyl moieties may be decomposed relatively easily, and carbon may then simply be exhausted from the process chamber. Additionally, as plasma power increases, bombardment of the layer may increase, which may remove pores and densify the layer, and which may further increase the dielectric constant of the layer. Accordingly, in some embodiments, the plasma may be generated at a plasma power of less than or about 500 W, and may be generated at less than or about 450 W, less than or about 400 W, less than or about 350 W, less than or about 300 W, less than or about 250 W, less than or about 200 W, less than or about 150 W, less than or about 100 W, less than or about 50 W, or less.

Similarly, the pressure at which the process may be performed may impact aspects of the process as well. For example, as pressure increases, absorption of atmospheric water may increase, which may increase the dielectric constant of the layer. As pressure is maintained lower, hydrophobicity of the layer may increase. Accordingly, in some embodiments the pressure may be maintained at less than or about 10

Torr to afford production of sufficiently low dielectric constant, and the pressure may be maintained at less than or about 9 Torr, less than or about 8 Torr, less than or about 7 Torr, less than or about 6 Torr, less than or about 5 Torr, less than or about 4 Torr, less than or about 3 Torr, less than or about 2 Torr, less than or about 1 Torr, less than or about 0.5 Torr, or less. However, to maintain plasma parameters to facilitate layer formation, the pressure may be maintained above or about 0.5 Torr, and may be maintained above or about 1 Torr, or higher.

In some embodiments, the process temperature during the formation of the layer of filling material 505 may be maintained at a temperature below or about 500° C., and in some embodiments may be maintained at less than or about 475° C., less than or about 450° C., less than or about 425° C., less than or about 400° C., less than or about 375° C., less than or about 350° C., less than or about 325° C., less than or about 300° C., less than or about 275° C., less than or about 250° C., less than or about 225° C., less than or about 200° C., less than or about 175° C., less than or about 150° C., less than or about 125° C., less than or about 100° C., less than or about 75° C., or less.

In some embodiments, the boron concentration of the layer of filling material 505 may be greater than or about 30%, and may be greater than or about 32%, greater than or about 34%, greater than or about 36%, greater than or about 38%, greater than or about 40%, greater than or about 42%, greater than or about 44%, greater than or about 46%, or more. Similarly, the carbon concentration of the layer of filling material 505 may be greater than or about 12%, and may be greater than or about 14%, greater than or about 16%, greater than or about 18%, greater than or about 20%, greater than or about 22%, greater than or about 24%, greater than or about 26%, greater than or about 28%, greater than or about 30%, or more. The nitrogen concentration of the layer of filling material 505 may be greater than or about 20%, and may be greater than or about 22%, greater than or about 24%, greater than or about 26%, greater than or about 28%, greater than or about 30%, greater than or about 32%, greater than or about 34%, greater than or about 36%, greater than or about 38%, or more. Once exposed to atmosphere, the layer of filling material 505 may include any amount of oxygen incorporation, which may be maintained at less than or about 15%, and may be maintained at less than or about 14%, less than or about 13%, less than or about 12%, less than or about 11%, less than or about 10%, less than or about 9%, less than or about 8%, or less.

While carbon or methyl groups may facilitate lower dielectric constant within the layer of filling material 505, a boron-to-nitrogen ratio within the film may affect the layer hardness and modulus.

Accordingly, in some embodiments, the boron-to-nitrogen ratio may be maintained at greater than or about 1:1, and may be maintained at greater than or about 1.2:1, greater than or about 1.4:1, greater than or about 1.6:1, greater than or about 1.8:1, greater than or about 2:1, or higher. The carbon-to-boron ratio may also facilitate the beneficial properties of the layer of filling material 505. For example, carbon incorporation may detrimentally impact layer hardness in a general sense, although when sufficiently bonded with boron based on the layer growth characteristics, hardness and modulus may be improved.

In some embodiments, the dielectric constant of the layer of filling material 505 may be less than or about 4.0, less than or about 3.9, less than or about 3.8, less than or about 3.7, less than or about 3.6, less than or about 3.5, less than or about 3.4, less than or about 3.3, less than or about 3.2, less than or about 3.1, less than or about 3.0, less than or about 2.9, less than or about 2.8, or less.

In some embodiments, the Young's modulus of the layer of filling material 505 may be maintained at greater than or about 40 GPa, and may be maintained at greater than or about 42 GPa, greater than or about 44 GPa, greater than or about 46 GPa, greater than or about 48

GPa, greater than or about 50 GPa, greater than or about 52 GPa, greater than or about 54 GPa, greater than or about 56 GPa, greater than or about 58 GPa, greater than or about 60 GPa, greater than or about 62 GPa, or higher. In some embodiments, the layer hardness of the layer of filling material 505 may be maintained at greater than or about 4.0 GPa, and may be maintained at greater than or about 4.1 GPa, greater than or about 4.2 GPa, greater than or about 4.3 GPa, greater than or about 4.4 GPa, greater than or about 4.5 GPa, greater than or about 4.6 GPa, greater than or about 4.7

GPa, greater than or about 4.8 GPa, or higher. These properties may be produced without additional treatment, such as UV or other processes.

With reference to FIG. 8, a planarization process may be performed until the top surfaces 105TS of the plurality of hard mask layers 105 are exposed to turn the layer of filling material 505 into the filling layer 201 between the adjacent pair of the plurality of conductive layers 103. It should be noted that the air gap 301 is not exposed after the planarization process. In other words, the air gap 301 is completely enclosed by the filling layer 201.

In some embodiments, the planarization process may be chemical mechanical polishing. In some embodiments, the planarization process may be an etching back process. In some embodiments, the etch rate ratio of the filling material 505 to the plurality of hard mask layers 105 may be between about 100:1 and about 3:1, between about 15:1 and about 3:1, or between about 10:1 and about 5:1 during the etching back process.

With reference to FIG. 8, the ratio of the distance D1 between the adjacent pair of the plurality of conductive layers 103 to the width W1 of the air gap 301 may be between about 50 and about 5, between about 40 and about 5, or between about 30 and about 5.

With reference to FIGS. 1 and 9, at step S15, a dielectric layer 107 may be formed on the plurality of hard mask layers 105 and the filling layer 201.

With reference to FIG. 9, the dielectric layer 107 may be formed of, for example, silicon oxide, silicon nitride, silicon oxynitride, or silicon nitride oxide. In some embodiments, the dielectric layer 107 may be formed of, for example, doped carbonitride or undoped carbonitride. In some embodiments, the dielectric layer 107 may include p-type dopants or n-types dopants p-type dopants or n-types dopants. The p-type dopants may be, for example, boron, aluminum, gallium, and indium. The n-type dopants may be, for example, antimony, arsenic, and phosphorus.

It should be noted that, in the description of the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

In some embodiments, a planarization process, such as chemical mechanical polishing, may be optionally performed to the dielectric layer 107 to provide a substantially flat surface for subsequent processing steps.

By employing the filling layer 201 having low dielectric constant and the air gap 301, the parasitic capacitance between the plurality of conductive layers 103 may be reduced. As a result, the performance of the semiconductor device 1A may be improved.

Figure 10:
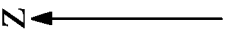
Figure 11:
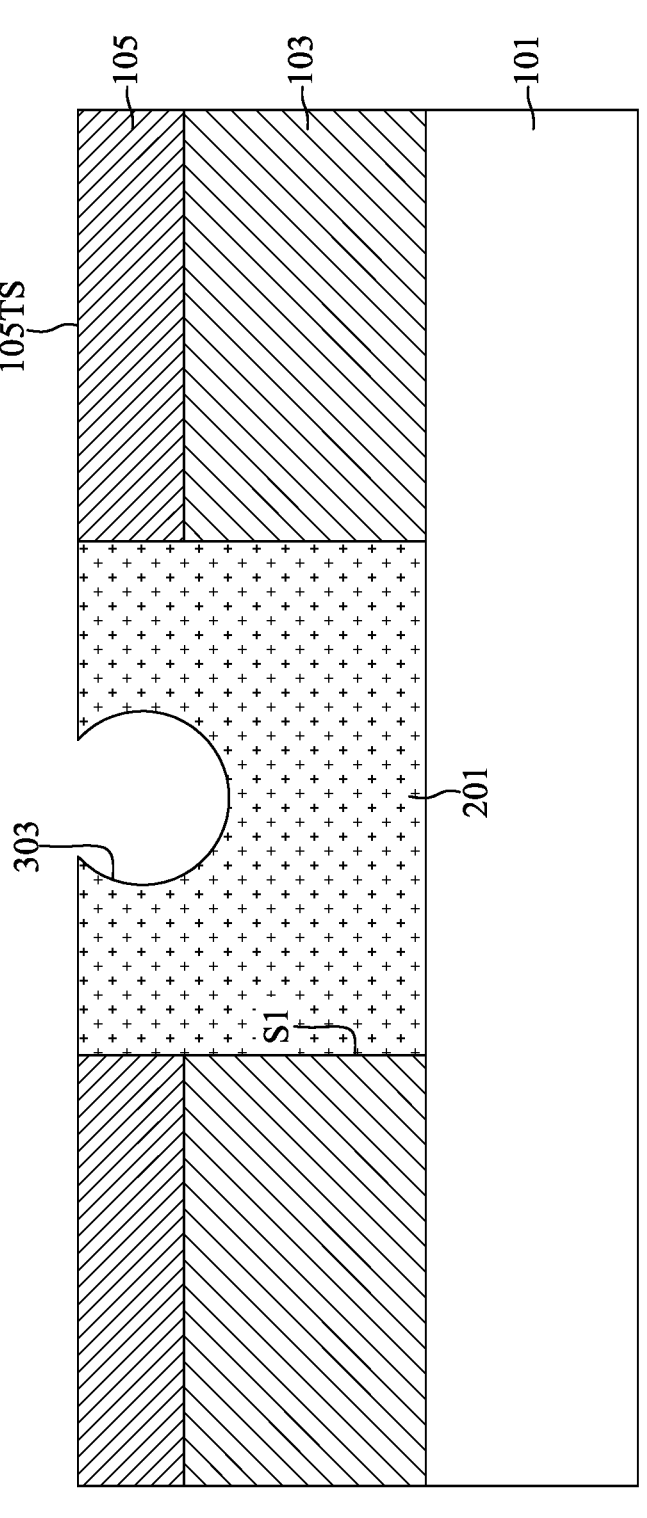

FIGS. 10 to 12 illustrate, in schematic cross-sectional view diagrams, part of a flow for fabricating a semiconductor device 1B in accordance with another embodiment of the present disclosure.

With reference to FIG. 10, an intermediate semiconductor device may be fabricated with a procedure similar to that illustrated in FIGS. 2 to 6, and descriptions thereof are not repeated herein. The layer of filling material 505 may be formed with a procedure similar to that illustrated in FIG. 7, and detailed descriptions thereof are not repeated herein. By adjusting the process conditions of the formation of the layer of filling material 505, a temporary air gap 301' may be formed in the layer of filling material 505. The top portion

301P' of the temporary air gap 301' may be at a vertical level VL2 higher than the top surfaces 105TS of the plurality of hard mask layers 105.

With reference to FIG. 11, a planarization process may be performed until the top surfaces 105TS of the plurality of hard mask layers 105 are exposed with a procedure similar to that illustrated in FIG. 8, and descriptions thereof are not repeated herein. After the planarization process, the temporary air gap 301' may be turned into a recess 303 exposed to the atmosphere.

With reference to FIG. 12, the dielectric layer 107 may be formed with a procedure similar to that illustrated in FIG. 9, and descriptions thereof are not repeated herein. The dielectric layer 107 may seal the recess 303 to form the air gap 301. The air gap 301 may be enclosed by the filling layer 201 and the dielectric layer 107.

Figure 14:
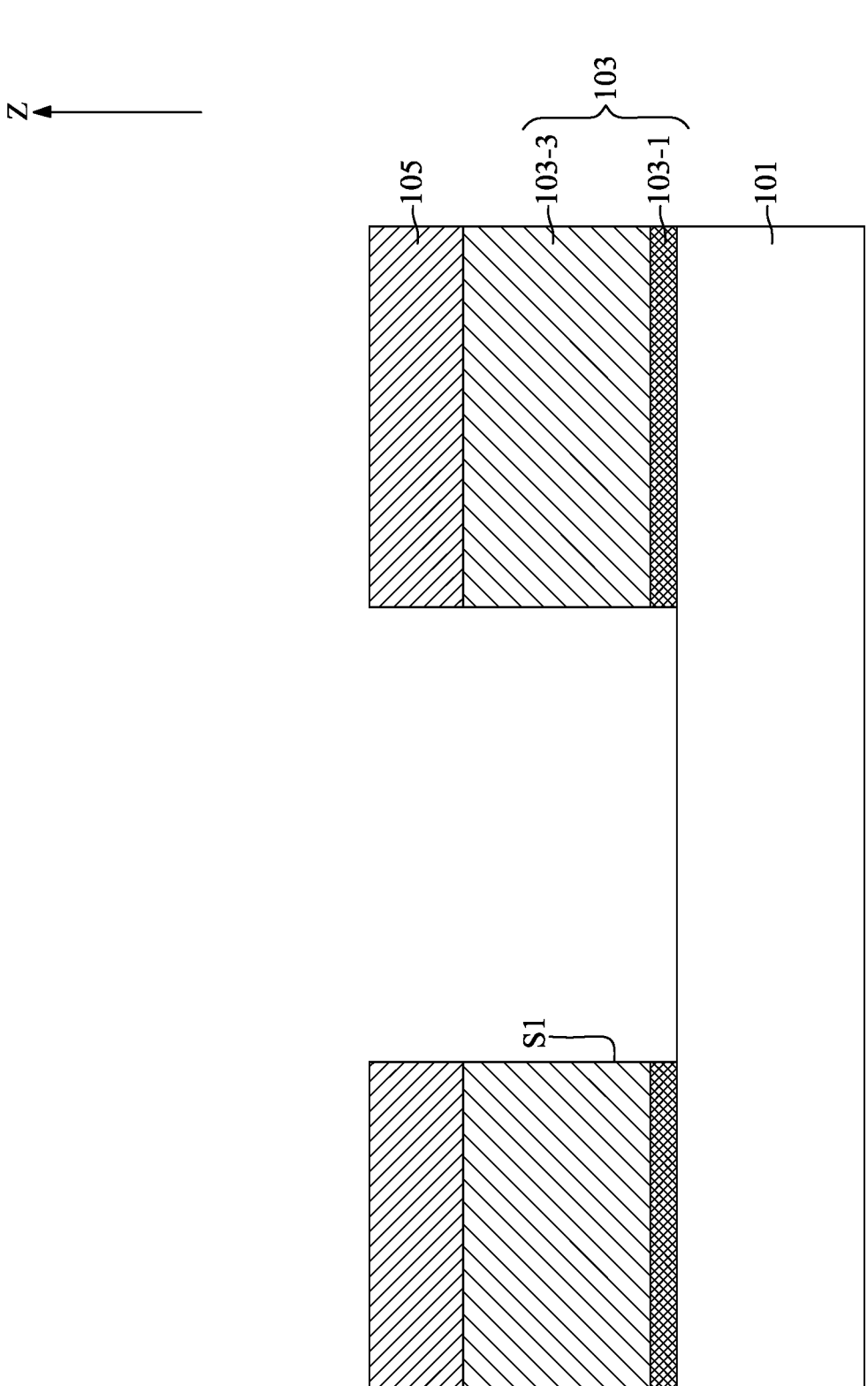
Figure 15:
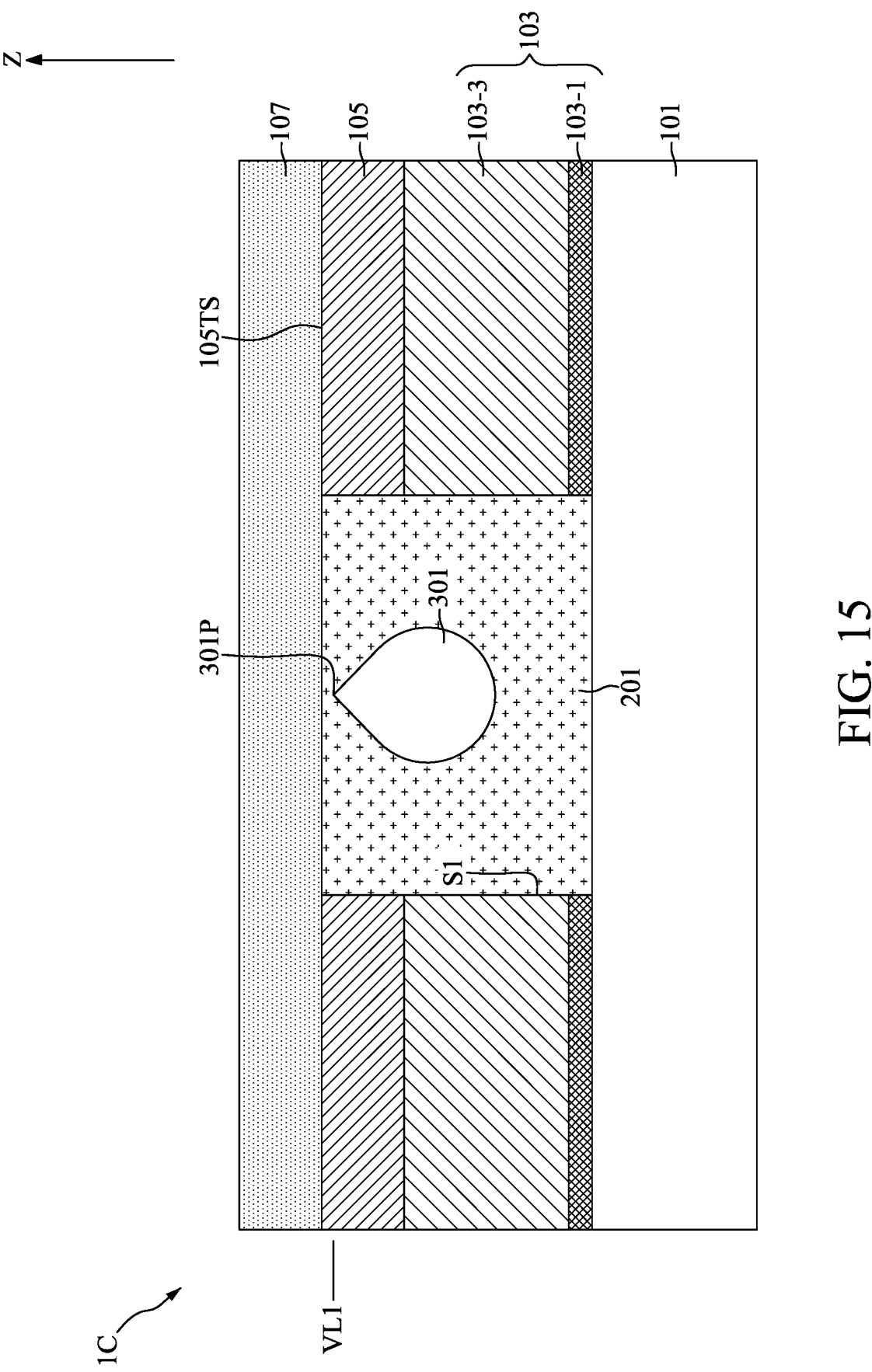

FIGS. 13 to 15 illustrate, in schematic cross-sectional view diagrams, part of a flow for fabricating a semiconductor device 1C in accordance with another embodiment of the present disclosure.

With reference to FIG. 13, the substrate 101 may be provided similar to the substrate 101 illustrated in FIG. 2, and descriptions thereof are not repeated herein.

With reference to FIG. 13, the conductive material 501 may be formed of, for example, tungsten and the layer of conductive material 501 may be composed of a nucleation layer 501-1 and a bulk layer 501-3. Detailedly, the nucleation layer 501-1 may be conformally formed on the substrate 101 and the bulk layer 501-3 may be formed on the nucleation layer 323-1. The nucleation layer 501-1 and the bulk layer 501-3 may include tungsten. Tungsten may be particularly useful in gate electrodes and word and bit lines in dynamic random access memory types of integrated circuit devices because of its thermal stability during subsequent high temperature processes, where processing temperatures may reach 900° C. or more. Additionally, tungsten is a highly refractive material which offers good oxidation resistance and lower resistivity.

In some embodiments, the nucleation layer 501-1 may be a thin conformal layer that serves to facilitate the subsequent formation of a bulk material (i.e., the bulk layer 501-3) thereon. Conforming to the underlying substrate 101 may be critical to support high quality deposition. In some embodiments, the nucleation layer 501-1 may be formed by a pulsed nucleation layer method.

In the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate 101, available to react with the next reactant. The process is repeated in a cyclical fashion until the desired thickness is achieved. It should be noted that the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

In some embodiments, the reactants of forming the nucleation layer 501-1 may be, for example, a silicon-containing reducing agent and a tungsten-containing precursor. The substrate 101 may be initially exposed to the silicon-containing reducing agent and followed by exposure to the tungsten-containing precursor to form the nucleation layer 501-1. The exposure to the silicon-containing reducing agent and the tungsten-containing precursor may be defined as a cycle and may be repeated until the desired thickness of the nucleation layer 501-1 is achieved.

Silane and related compounds have been found to adsorb well to metal nitride surfaces such as titanium nitride and tungsten nitride used as barrier layer materials in some integrated circuit applications.

Any suitable silane or silane derivative may be used as the silicon-containing reducing agent, including organic derivatives of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the silicon-containing reducing agent may be between about 200° C. and about 475° C., between about 300° C. and about 400° C., or about 300° C. In some embodiments, the chamber pressure during exposure to the silicon-containing reducing agent may be between about 1 Torr and about 350 Torr or be fixed around 40 Torr. The exposure time (or pulse time) may vary depending in part upon dosages and chamber conditions. In some embodiments, the substrate 101 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

In some embodiments, once the substrate 101 is sufficiently covered with silane species, the flow of the silicon-containing reducing agent may be stopped. A purge process may be performed to clear residual gas reactants near the surface of the substrate 101. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying with gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the nucleation layer 501-1.

Thereafter, the flow of tungsten-containing precursor may be stopped, and a purge process may be performed with a carrier gas such as argon, hydrogen, nitrogen, or helium.

Alternatively, in some embodiments, the reactants of forming the nucleation layer 501-1 may be, for example, a boron-containing reducing agent and the tungsten-containing precursor. The substrate 101 may be initially exposed to the boron-containing reducing agent and followed by exposure to the tungsten-containing precursor to form the nucleation layer 501-1. The exposure to the boron-containing reducing agent and the tungsten-containing precursor may be defined as a cycle and may be repeated until the desired thickness of the nucleation layer 501-1 is achieved.

In some embodiments, the boron-containing reducing agent may be, for example, borane, diborane, triborane, or boron halides (e.g., $BF_3$, $BCl_3$) with hydrogen. The tungsten-containing precursor may be material similar to the tungsten-containing precursor mentioned above, and descriptions thereof are not repeated herein. In some embodiments, the boron-containing reducing agent may be provided in a dilution gas, accompanying with gases such as argon, nitrogen, hydrogen, silane, or a combination thereof. For example, diborane may be provided from a diluted source (e.g., 5% diborane and 95% nitrogen). In some embodiments, the substrate temperature during exposure to the boron-containing reducing agent may be between about 200° C. and about 475° C., between about 300° C. and about 400° C., or about 300° C.

In some embodiments, the chamber pressure during exposure to the boron-containing reducing agent may be between about 1 Torr and about 350 Torr. In some embodiments, once the boron-containing reducing agent is deposited to a sufficient thickness, the flow of boron-containing reducing agent may be stopped. A purge process may be performed with a carrier gas such as argon, hydrogen, nitrogen, or helium.

After exposure to the boron-containing reducing agent, the intermediate semiconductor device may be then exposed to the tungsten-containing precursor. The process is similar to that exposure to the tungsten-containing precursor after exposing to the silicon-containing reducing agent, and descriptions thereof are not repeated herein.

In some embodiments, a pre-treatment may be performed to the substrate 101 before forming the nucleation layer 501-1 using exposure to the boron-containing reducing agent and the tungsten-containing precursor. The pre-treatment may include diborane.

In some embodiments, exemplary data reveals that the diborane-based nucleation layer 501-1 may produce tungsten with greater grain size in the initial stage of forming the nucleation layer 501-1. In contrast, the silane-based nucleation layer 501-1 may produce tungsten with smaller grain size in the initial stage of forming the nucleation layer 501-1. That is, the deposited bulk layer 501-3 form on the silane-based nucleation layer 501-1 may have less or no defects such as seam and void.

Alternatively, the nucleation layer 501-1 may be formed by being sequentially exposed to the silicon-containing reducing agent, the tungsten-containing precursor, the boron-containing reducing agent, and the tungsten-containing precursor. The four steps of exposure may be defined as a cycle. The entire four-step cycle may be repeated to form the nucleation layer 501-1 with the desired thickness.

In a variation of the process, the first two steps of the cycle (sequential exposure to the silicon-containing reducing agent and the tungsten-containing precursor) may be repeated one or more times prior to contact with the boron-containing reducing agent. In another variation, the last two steps of the cycle (sequential exposure to the boron-containing reducing agent and the tungsten-containing precursor) may be repeated one or more times after the first two steps are completed.

Alternatively, in some embodiments, the reactants of forming the nucleation layer 501-1 may be, for example, a germanium-containing reducing agent and the tungsten-containing precursor. The substrate 101 may be initially exposed to the germanium-containing reducing agent and followed by exposure to the tungsten-containing precursor to form the nucleation layer 501-1. In some embodiments, the germanium-containing reducing agent may be a germane such as $Ge_nH_{n+4}$, $Ge_nH_{n+6}$, $Ge_nH_{n+8}$, and $Ge_nH_m$, where n is an integer from 1 to 10, and n is a different integer than m. Other germanium-containing compounds may also be used, for example, alkyl germanes, alkyl germanium, aminogermanes, carbogermanes, and halogermane. The tungsten-containing precursor may be material similar to the tungsten-containing precursor mentioned above, and descriptions thereof are not repeated herein.

An exemplary process for forming the nucleation layer 501-1 may be illustrated as follows.

Firstly, the substrate 101 may be exposed to pulses of the germanium-containing reducing agent in a hydrogen environment to form a layer of germanium on the substrate 101. In some embodiments, the hydrogen-to-germanium-containing reducing agent ratio may be about 10:1, about 50:1, about 70:1, or about 100:1. The presence of hydrogen may decrease the thickness deposited per cycle, as well as decrease the resistivity of the deposited bulk layer 501-3.

In some embodiments, pulses of one or more additional reducing agents, such as pulses of the boron-containing or silicon-containing reducing agent, may be used. The additional reducing agents may be pulsed sequentially or simultaneously with the germanium-containing reducing agent. In some embodiments, interval time pauses between pulses may be between about 0.5 seconds and about 5 seconds. In some embodiments, the pulses of germanium-containing reducing agent may be optional, only the pulses of the boron-containing or silicon-containing reducing agent may be used.

In some embodiments, the duration of pulse (or pulse time) may be between about 0.25 seconds and about 30 seconds, between about 0.25 seconds and about 5 seconds, or between about 0.5 seconds and about 3 seconds. The pulse may be sufficient to saturate or oversaturate the surface of the substrate 101. In some embodiments, a carrier gas may be used, such as argon, helium, or nitrogen. In some embodiments, an optional purge process may be performed to purge excess germanium-containing reducing agent still in gas phase that did not adsorb to the surface of the substrate 101. The purge process may be conducted by flowing an inert gas at a fixed pressure thereby reducing the pressure of the chamber and re-pressurizing the chamber before initiating another gas exposure.

Next, the substrate 101 may be exposed to pulses of the tungsten-containing precursor. The tungsten-containing precursor reacts with the deposited layer of germanium to form elemental tungsten. In some embodiments, the duration of pulse (or pulse time) may be between about 0.25 seconds and about 30 seconds, between about 0.25 seconds to about 5 seconds, or between about 0.5 seconds to about 3 seconds. The pulse may be sufficient to react with the reactive sites on the surface of the substrate 101 where germanium adsorbs onto the surface. In some embodiments, the interval time pauses between pulses may be between about 0.5 seconds and about 5 seconds.

In some embodiments, a carrier gas may be used, such as argon, helium, or nitrogen. In some embodiments, exposure to the tungsten-containing precursor may be performed in a hydrogen environment. In some embodiments, an optional purge process may be performed to purge excess tungsten-containing precursor still in the gas phase that did not react to the germanium adsorbed onto the surface of the substrate

101. The purge process may be conducted by flowing an inert gas at a fixed pressure thereby reducing the pressure of the chamber and re-pressurizing the chamber before initiating another gas exposure.

Finally, exposure to the pulses of the germanium-containing reducing agent and the tungsten-containing precursor may be repeated until a desired thickness of the nucleation layer 501-1 is deposited on the surface of the substrate 101. Each repetition of exposure to the pulses of the germanium-containing reducing agent and the tungsten-containing precursor may be referred to as a cycle.

In some embodiments, the order of exposure to the pulses of the germanium-containing reducing agent and the tungsten-containing precursor may be reversed, such that the tungsten-containing precursor is pulsed first.

With reference to FIG. 13, the bulk layer 501-3 may be formed on the nucleation layer 501-1. The bulk layer 501-3 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof.

For example, the deposition of the bulk layer 501-3 using chemical vapor deposition may include flowing (or introducing) a tungsten-containing precursor and a co-reactant such as a reducing agent to the intermediate semiconductor device including the nucleation layer 501-1. Example process pressure may be between about 10 Torr and about 500 Torr. Example substrate temperature may be between about 250° C. and about 495° C. The tungsten-containing precursor may be, for example, tungsten hexafluoride, tungsten chloride, or tungsten hexacarbonyl. The reducing agent may be, for example, hydrogen gas, silane, disilane, hydrazine, diborane, or germane.

In some embodiments, the grain size of tungsten of the bulk layer 501-3 may be greater than 30 nm, than 50 nm, than 70 nm, than 80 nm, than 85 nm, or than 87 nm. In some embodiments, the bulk layer 501-3 may include alpha phase tungsten.

With reference to FIG. 14, the first hard mask etching process and the first etching process may be performed with a procedure similar to that illustrated in FIGS. 3 to 6, and descriptions thereof are not repeated herein. After the first etching process, the remaining nucleation layer 501-1 may be turned into a plurality of nucleation portions 103-1 formed on the substrate 101. The remaining bulk layer 501-3 may be turned into a plurality of bulk portions 103-3 formed on the plurality of nucleation portions 103-1. The plurality of nucleation portions 103-1 and the plurality of bulk portions 103-3 together configure the plurality of conductive layers 103.

With reference to FIG. 15, the filling layer 201, the air gap 301, and the dielectric layer 107 may be formed with a procedure similar to that illustrated in FIGS. 7 to 9, and descriptions thereof are not repeated herein. The top portion 301P of the air gap 301 may be at the vertical level VL1 lower than the top surfaces 105TS of the plurality of hard mask layers 105.

Figure 16:
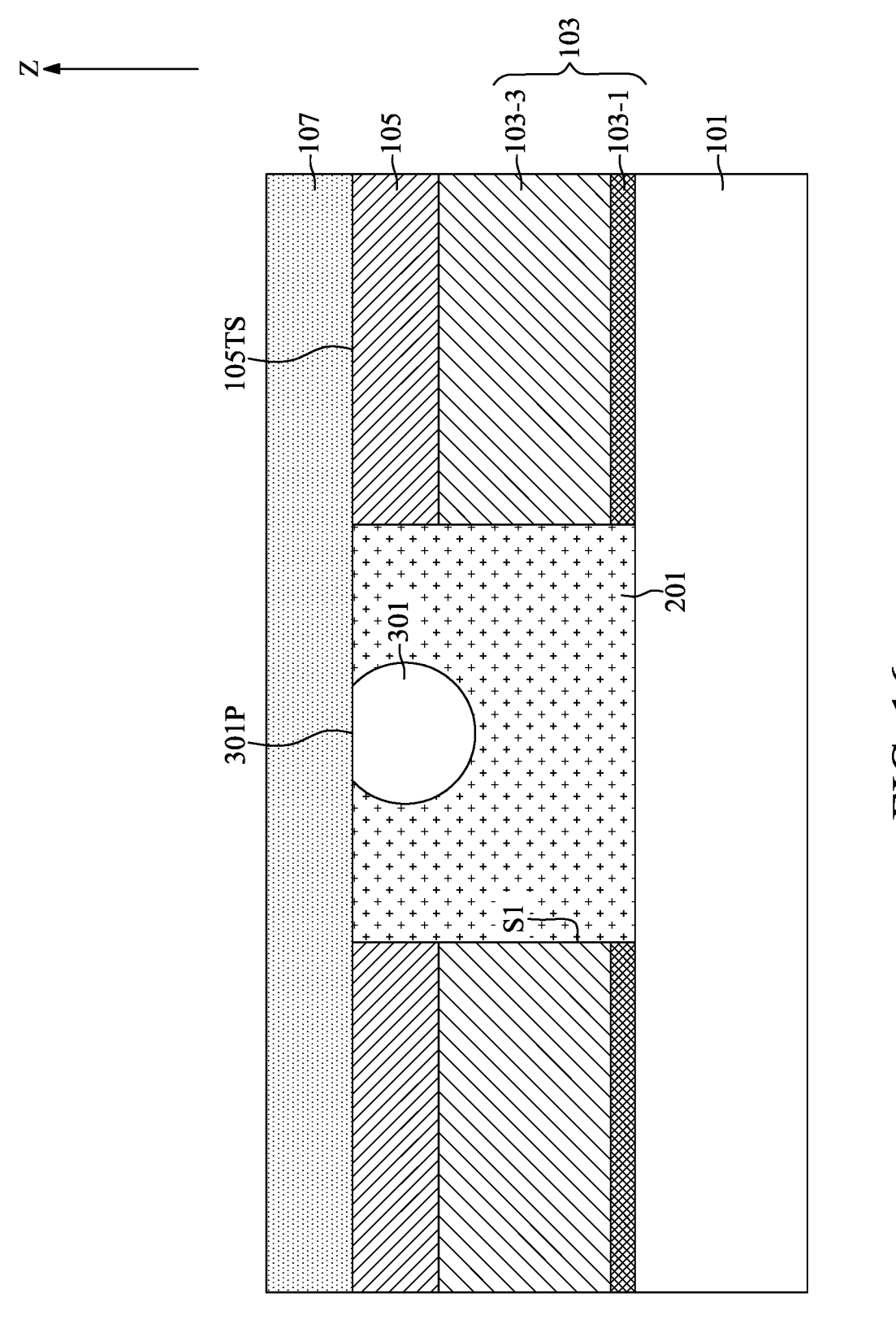
FIG. 16 illustrates, in a schematic cross-sectional view diagram, a semiconductor device in accordance with another embodiment of the present disclosure.

FIG. 16 illustrates, in a schematic cross-sectional view diagram, a semiconductor device 1D in accordance with another embodiment of the present disclosure.

With reference to FIG. 16, the semiconductor device 1D may have a structure similar to that illustrated in FIG. 15. The same or similar elements in FIG. 16 as in FIG. 15 have been marked with similar reference numbers and duplicative descriptions have been omitted. In the semiconductor device 1D, the air gap 301 may be enclosed by the filling layer 201 and the dielectric layer 107. The top portion 301P of the air gap 301 and the top surfaces 105TS of the plurality of hard mask layers 105 may be substantially coplanar.

One aspect of the present disclosure provides a semiconductor device including a substrate; a plurality of conductive layers positioned on the substrate; a filling layer positioned between the plurality of conductive layers; an air gap positioned in the filling layer; and a dielectric layer positioned on the plurality of conductive layers and the filling layer. The filling layer includes boron carbonitride.

Another aspect of the present disclosure provides a semiconductor device including a substrate; a plurality of conductive layers positioned on the substrate; a filling layer positioned between the plurality of conductive layers; a dielectric layer positioned on the plurality of conductive layers and the filling layer; and an air gap positioned in the filling layer and sealed by the dielectric layer. The filling layer includes boron carbonitride.

Another aspect of the present disclosure provides a method for fabricating a semiconductor device including providing a substrate; forming a plurality of conductive layers on the substrate and forming a plurality of hard mask layers on the plurality of conductive layers; forming a filling layer between the plurality of conductive layers and between the plurality of hard mask layers and forming an air gap in the filling layer; and forming a dielectric layer on the plurality of hard mask layers and the filling layer. The filling layer includes boron carbonitride.

Another aspect of the present disclosure provides a method for fabricating a semiconductor device including providing a substrate; forming a plurality of conductive layers on the substrate; forming a plurality of hard mask layers on the plurality of conductive layers; forming a layer of filling material to cover top surfaces of the plurality of hard mask layers and partially fill a space between the plurality of conductive layers; performing a planarization process until the top surfaces of the plurality of hard mask layers are exposed to turn the layer of filling material into the filling layer and concurrently form a recess in the filling layer; and forming a dielectric layer on the plurality of hard mask layers and the filling layer and sealing the recess to form an air gap. The filling layer includes boron carbonitride.

Due to the design of the semiconductor device of the present disclosure, the parasitic capacitance between the plurality of conductive layers 103 may be reduced by employing the filling layer 201 having low dielectric constant and the air gap 301. As a result, the performance of the semiconductor device 1A may be improved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a plurality of conductive layers positioned on the substrate;
a filling layer positioned between the plurality of conductive layers, wherein the filling layer comprises boron carbonitride;
a dielectric layer positioned on the plurality of conductive layers and the filling layer;
an air gap positioned in the filling layer and sealed by the dielectric layer, wherein a bottom of the air gap is positioned above a bottom surface of the filling layer, such that the bottom of the air gap is sealed by the filing layer; and
a plurality of hard mask layers positioned between the dielectric layer and the plurality of conductive layers and surrounding the filling layer, wherein a top portion of the air gap and top surfaces of the hard mask layers are coplanar.

2. The semiconductor device of claim 1, wherein a ratio of a distance between the plurality of conductive layers to a width of the air gap is between about 50 and about 5.

3. The semiconductor device of claim 2, wherein the plurality of conductive layers comprise tungsten, cobalt, zirconium, tantalum, titanium, aluminum, ruthenium, copper, metal carbides, metal nitrides, transition metal aluminides, or a combination thereof.

4. The semiconductor device of claim 3, wherein the plurality of hard mask layers comprise silicon oxide, silicon nitride, silicon oxynitride, or silicon nitride oxide.

5. The semiconductor device of claim 4, wherein the dielectric layer comprises silicon oxide, silicon nitride, silicon oxynitride, silicon nitride oxide, undoped carbonitride, or doped carbonitride.

6. The semiconductor device of claim 4, wherein the dielectric layer comprises p-type dopants or n-types dopants.

7. The semiconductor device of claim 1, further comprising a space extended between the hard mask layer and between the conductive layers to expose the substrate, wherein the filing layer is filled into the space to form the air gap within the space.

* * * * *